United States Patent
Kelekar

(10) Patent No.: US 8,058,171 B1
(45) Date of Patent: Nov. 15, 2011

(54) STIRRING APPARATUS FOR COMBINATORIAL PROCESSING

(75) Inventor: Rajesh Kelekar, Los Altos, CA (US)

(73) Assignee: Intermolecular, Inc., San Jose, CA (US)

( * ) Notice: Subject to any disclaimer, the term of this patent is extended or adjusted under 35 U.S.C. 154(b) by 791 days.

(21) Appl. No.: 12/140,926

(22) Filed: Jun. 17, 2008

(51) Int. Cl.
*H01L 21/66* (2006.01)
*C25D 5/02* (2006.01)
*C25B 15/08* (2006.01)
*B05B 7/06* (2006.01)

(52) U.S. Cl. ........ 438/678; 118/313; 205/126; 366/196; 366/315; 366/317; 366/343; 427/437

(58) Field of Classification Search ................... 366/196, 366/315, 317, 342, 343; 422/225; 118/313; 205/126; 427/437; 438/678
See application file for complete search history.

(56) References Cited

U.S. PATENT DOCUMENTS

| | | | |
|---|---|---|---|
| 6,638,564 B2 * | 10/2003 | Segawa et al. ............. | 427/8 |
| 2004/0137161 A1 * | 7/2004 | Segawa et al. ............. | 427/430.1 |
| 2007/0029189 A1 * | 2/2007 | Zach ............................ | 204/228.3 |
| 2009/0155476 A1 * | 6/2009 | Francis et al. .............. | 427/421.1 |
| 2009/0155936 A1 * | 6/2009 | Weiner et al. ................ | 438/17 |

FOREIGN PATENT DOCUMENTS

| JP | 11246834 A * | 9/1999 |
|---|---|---|
| JP | 2001316834 A * | 11/2001 |

OTHER PUBLICATIONS

Translation of JP 11-246980 dated Sep. 1999 obtained from the JPO website.*

* cited by examiner

*Primary Examiner* — Robert B Davis

(57) ABSTRACT

An apparatus and system for stirring liquid inside a flow cell. In one implementation, the apparatus includes a rotatable disc configured to receive liquid at a top side of the disc and distribute the liquid substantially evenly around a periphery of the flow cell. The disc has a triangular cross sectional area. The apparatus may further include a set of fins attached to a bottom side of the disc, wherein the set of fins is configured to draw the liquid from the periphery of the flow cell into the center of the flow cell.

22 Claims, 6 Drawing Sheets

STIRRING APPARATUS FOR COMBINATORIAL PROCESSING

This invention was made with US government support under contract number H94003-07-C-0712. The U.S. government has certain rights in this invention.

BACKGROUND

1. Field of the Invention

Implementations of various technologies described herein generally relate to combinatorial processing and specifically to techniques for stirring during combinatorial processing.

2. Description of the Related Art

The following descriptions and examples do not constitute an admission as prior art by virtue of their inclusion within this section.

Spin processing may be used to deposit and distribute solutions over substrates. Spin processing may be performed using a spin processor that includes a chuck onto which a substrate is mounted. The chuck may rotate and spin while a solution is dispensed onto the center of the substrate. Centrifugal force distributes the solution over the surface of the substrate and excess solution is ejected off the wafer.

Combinatorial processing may refer to various techniques to vary the processes applied to multiple regions of a substrate in serial, parallel or parallel-serial fashion. Combinatorial processing may be used to test and compare multiple and various processing techniques. The processing techniques may be validated and those techniques that are useful may be applied to, for example, different substrates or full-substrate processing. Some of these processing techniques may mimic spin processing.

BRIEF DESCRIPTION OF THE DRAWINGS

Implementations of various technologies will hereafter be described with reference to the accompanying drawings. It should be understood, however, that the accompanying drawings illustrate only the various implementations described herein and are not meant to limit the scope of various technologies described herein.

DETAILED DESCRIPTION

Figure 1:
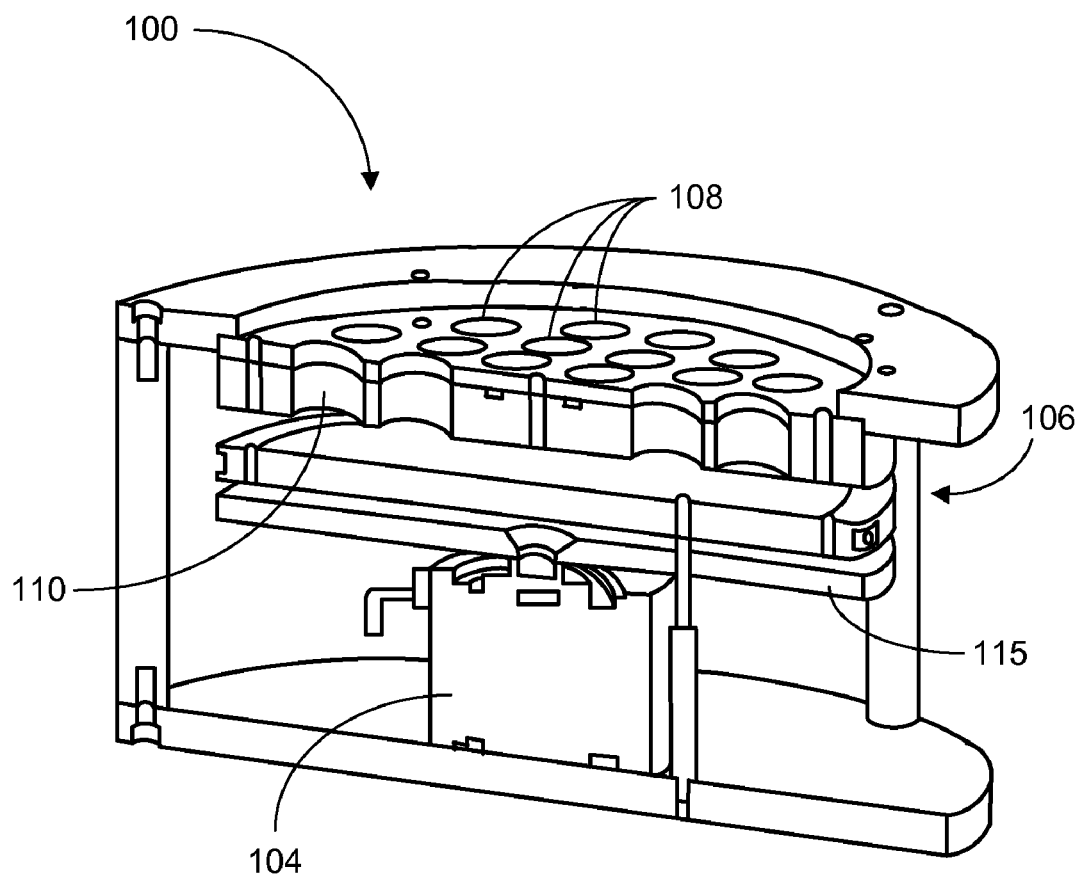
FIG. 1 illustrates a combinatorial processing tool in which various technologies may be incorporated and used.

The discussion below is directed to certain specific implementations. It is to be understood that the discussion below is only for the purpose of enabling a person with ordinary skill in the art to make and use any subject matter defined now or later by the patent "claims" found in any issued patent herein.

Various technologies described herein are generally directed to combinatorial processing, and in particular, a stirring apparatus that may be used in a flow cell of a combinatorial processing tool. The stirring apparatus includes a disc and a set of fins attached to a bottom side of the disc. The stirring apparatus, including the disc and the set of fins, is rotatable during operation. The disc may have a cross section of a triangle or a wedge. In this manner, the sloped portion of the disc is configured to receive liquid from the liquid dispenser and distribute the liquid substantially evenly around the periphery of the flow cell. The set of fins may include a first fin and a second fin parallel to the first fin. Both the first fin and the second fin are disposed at an offset from the diameter of the disc. In this manner, the fins are configured to draw the liquid from the periphery of the flow cell to the center of the flow cell. The disc and the fins are described in more detail in the paragraphs below with reference to FIGS. 3 and 4.

The following paragraphs provide a brief description of combinatorial processing and how the stirring apparatus may be used as part of the combinatorial processing. Combinatorial processing may include any processing, including semiconductor processing, which varies the processing conditions across one or more regions of one or more substrates. As used herein, a substrate may be, for example, a semiconductor wafer, a portion of a semiconductor wafer, solar photovoltaic circuitry, or other semiconductor substrate. The term "substrate" also includes a coupon, which is a diced portion of a wafer, or any other device on which semiconductor processes are performed. The coupon or substrate may optionally contain one die, multiple dice (connected or not through the scribe), or portion of die with useable test structures. In some implementations, multiple coupons, or die can be diced from a single wafer and processed combinatorially.

Combinatorial processing is performed by varying processing conditions across multiple substrates, multiple regions of a single substrate, or a combination of the two. Processing conditions may include, for example, chemical formulation, fluid flow rates, temperatures, reaction times, concentrations, agitation or stirring, and the like. For example, a first region of a substrate may be processed using a first process condition (e.g., applying a chemical at a first temperature) and a second region of the substrate may be processed using a second process condition (e.g., applying the chemical at a second temperature). The results (e.g., the measured characteristics of the processed regions) are evaluated, and none, one, or both of the process conditions may be selected as suitable candidates for larger scale processing (e.g., further combinatorial processing or deposition on a full wafer). Techniques for combinatorial processing are described in U.S. patent application Ser. No. 11/352,077, entitled "Methods For Discretized Processing and Process Sequence Integration of Regions of a Substrate."

Using combinatorial processing, multiple experiments may therefore be simultaneously run such that tests of different solutions and chemistries may be performed and analyzed. Once the various experiments have been run, each of the multiple regions may be examined or tested, e.g., by using various metrologies such as electronic testing (e-testing) including capacitance and resistance testing, and microscopy including scanning electron microscope (SEM) images, transmission electron microscope (TEM) images, and atomic force microscope (AFM) images. Once a particular formulation has been validated through testing, the compositions may be adapted to a full substrate.

Several combinatorial processing tools can be used. One type of tool may include a reactor block that has several openings (e.g., cylindrical openings) that define individual reactors on a single substrate. For example, a reactor block may include 28 openings that define 28 regions on a substrate. Each of the 28 regions can be processed using varying process conditions, or multiple regions can have the same processing conditions. For example, seven sets of processing conditions can be performed across four regions each. Each region can then be characterized using various techniques (e.g., electrical test, microscopy), and useful or beneficial techniques and/or conditions can be selected.

In one implementation, each opening in a reactor block may include a sleeve that creates a seal with the substrate to contain processing fluids or chemicals within a single reactor. As such, the combinatorial processing performed inside the reactor may be site isolated.

In another implementation, combinatorial processing may be performed in a manner that is not site isolated. For example, a wafer can be divided into many small coupons, each of which can be processed using different conditions. Using another example, a wafer can be processed using a gradient approach, where the processing varies over the substrate. These techniques can be combined with the other techniques (e.g., varying conditions across regions of one or more substrates) described herein. In some implementations, combinatorial processing can also be combined with non-combinatorial processing, such as, full-wafer processing.

Certain processes, such as wet processes used in semiconductor processing, may be performed by dispensing fluids onto a substrate and spinning the substrate to distribute the fluid over the surface of the substrate using a spin processor. When combinatorial processing is performed using multiple regions on a single substrate, it may not be possible to spin the substrate to distribute the fluid as in a spin processor. Consequently, the combinatorial processing may not be able to adequately simulate these processes. However, a stirring apparatus, such as the one shown in FIG. 3A, may be used to agitate a fluid introduced onto a substrate. The stirring apparatus may be used to dispense and spin fluids onto a region of a substrate in such a way that the combinatorial processing may substantially mimic a spin processor for purposes of the experimentation.

FIG. 1 illustrates a combinatorial processing tool 100 in which one or more implementations of various technologies described herein may be incorporated and used. Although various implementations described herein are with reference to the combinatorial processing tool 100, it should be understood that some implementations may use other types of combinatorial processing tool, such as a combinatorial processing tool with an open deck or any other type of combinatorial processing tool that uses stirring.

The combinatorial processing tool 100 may include a reactor block 106 having a plurality of reactor cells 108. The reactor block 106 is configured to mate with a stage or chuck 104, which is configured to secure a substrate 115. The combinatorial processing tool 100 may also include a floating reactor sleeve or wall 110, which may be configured to float or be dynamically positionable in each reactor cell 108.

The combination of the reactor cell 108 that includes the floating sleeve 110 may thus form a reactor 108 that provides individual compliance of each reactor edge surface 112 (formed by the floating sleeve 110) with a localized surface of the substrate 115. In one implementation, the compliance of each reactor sleeve 110 within the reactor 108 may be facilitated by an o-ring. In another implementation, the compliance of each reactor sleeve 110 may also be facilitated by a flexure-type mechanism, for example, a lip seal integrated directly into the sleeve wall. In some implementations, no sleeve is used and a seal is attached directly to the reactor block.

Use of the floating sleeves 110 in each reactor cell 108 allows for replacement of individual reactor walls that may become contaminated or otherwise unsuitable for continued use in a reactor. Further, the floating of each reactor cell 108 within the reactor block 106 provided by the floating sleeves 110 allows larger manufacturing tolerances of reactor components while still providing a high probability that a seal is achieved for each reactor.

Figure 2:
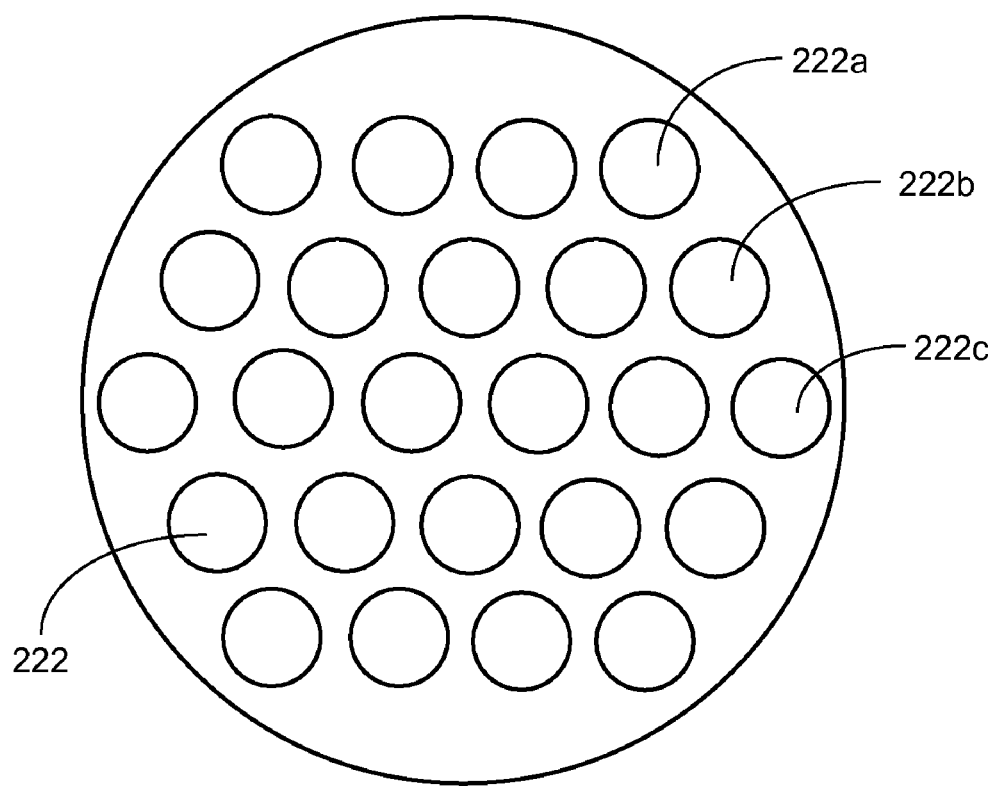
FIG. 2 illustrates a substrate having multiple regions for combinatorial processing in accordance with various techniques described herein.

FIG. 2 illustrates a substrate 200 having multiple regions for combinatorial processing in accordance with various techniques described herein. Substrate 200 includes several regions 222 on which semiconductor processes can be performed. For example, regions 222a, 222b, and 222c may each have an electroless layer deposited on them. Region 222a may use a first chemical formulation, region 222b may use a second chemical formulation, and region 222c may use a third chemical formulation. The resulting layers may then be compared to determine the relative efficacy of each of the formulations. None, one, or more of the formulations may be selected for use in further combinatorial processing or larger scale processing (e.g., manufacturing). Any process variable (e.g., time, composition, temperature) can be varied using combinatorial processing. Each of the regions 222 may be processed using a flow cell of 108 of a combinatorial processing tool 100, as described in FIG. 1.

Each of the regions 222 may or may not be site isolated. Site isolation refers to a condition where the regions 222 can be processed individually and independently without interference from neighboring regions. For example, one or more of the regions 222 may include a sleeve, e.g., floating sleeve 110, having an end that forms a fluid seal with the substrate 220. The sleeve is configured to contain processing fluids (e.g., chemicals), and is made from a material (e.g., polytetrafluoroethylene (PTFE)) that does not react with the processing chemicals used. The chemicals do not leak out of the region into which they were dispensed, and each region 222 can be processed and evaluated individually.

Figure 3A:
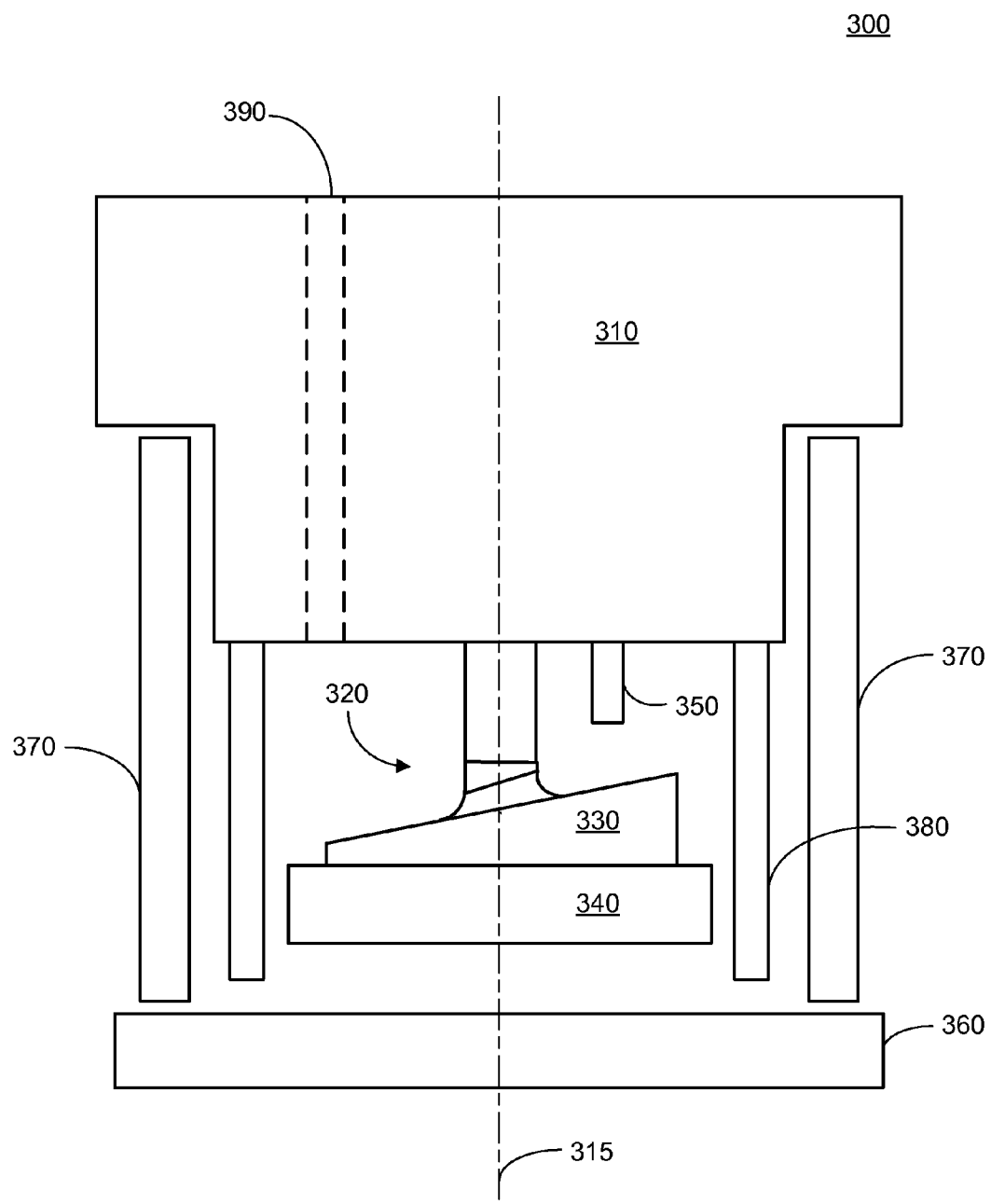
FIG. 3A illustrates a flow cell in accordance with implementations of various technologies described herein.

FIG. 3A illustrates a flow cell 300 in accordance with implementations of various technologies described herein. The flow cell 300 may include a manifold 310, which may contain isolation valves, a motor and various components for operating the flow cell 300. A liquid dispenser 350 is disposed below the manifold 310. The liquid dispenser 350 is configured to provide liquid into the flow cell 300. The liquid may be any solution typically used in semiconductor processing, e.g., cleaning fluid, deposition fluid, etching solutions and the like. The liquid may also be gas, plasma, colloids, suspensions and the like. In one implementation, the liquid may be introduced continuously for a predetermined amount of time.

The flow cell 300 may further include floating sleeves 370 defining a region on the substrate 360 to be processed by the flow cell 300. The floating sleeves 370 may form a fluid seal with the substrate 360. As such, the floating sleeves 370 may be configured to contain processing fluids inside the region defined by the floating sleeves 370.

Figure 3B:
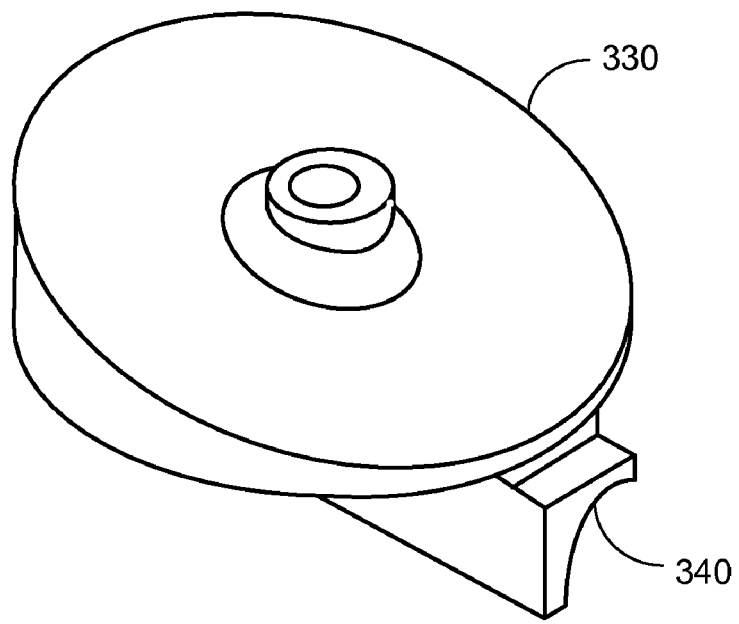
FIG. 3B illustrates a perspective view of a disc with a fin disposed below the disc in accordance with various implementations described herein.
Figure 3C:
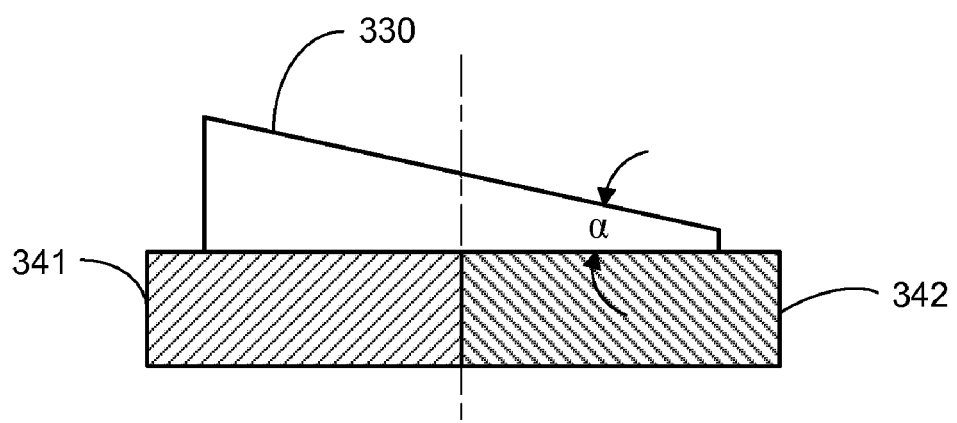
FIG. 3C illustrates a cross sectional view of the disc in accordance with various implementations described herein.

A stirring apparatus 320 may be disposed below the manifold 310. In one implementation, the stirring apparatus 320 may be used to homogenize the chemical reaction over the area of the substrate enclosed by the flow cell 300. In other words, the stirring apparatus 320 may evenly distribute liquid across the substrate so that the reaction is rotationally symmetric. In this manner, the stirring apparatus 320 may distribute liquids throughout the region which can in some implementations perform a function similar to that of a spin processor. The stirring apparatus 320 may include a disc 330 and a set of fins 340 disposed below the disc 330. FIG. 3B illustrates a perspective view of the disc 330 with a fin 340 disposed below the disc 330. The disc 330 may have a cross section of a triangle or a wedge. In one implementation, the disc 330 may have a slope a of about 15 degrees with respect to the bottom side, as shown in FIG. 3C. In another implementation, the disc 330 may be aligned along the central axis 315 of the stirring apparatus 320.

Figure 3D:
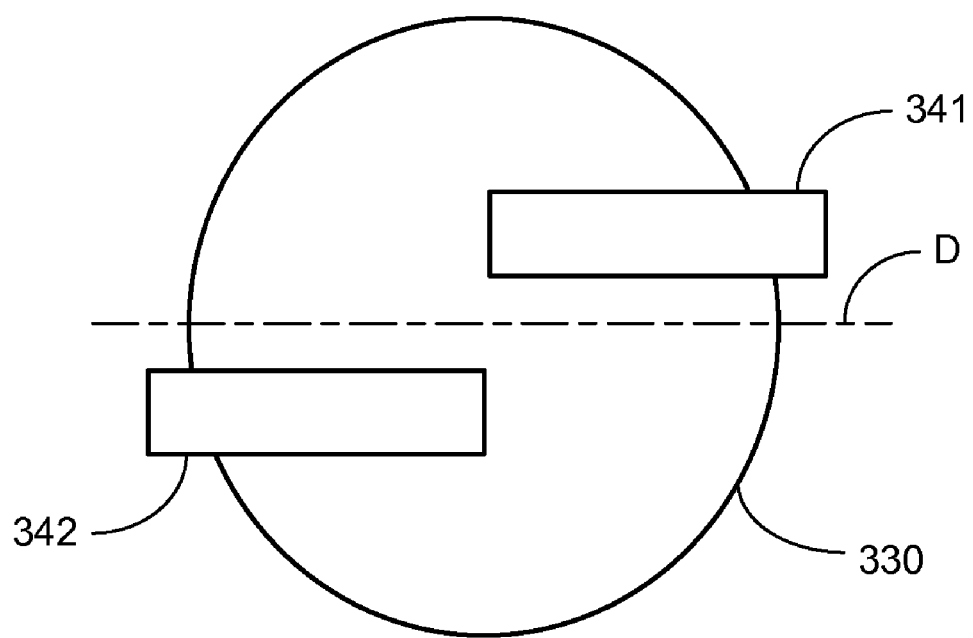
FIG. 3D illustrates a bottom view of a disc in accordance with various implementations described herein.

The fins 340 may be attached to the bottom side of the disc 330 at an offset from a radius or a diameter of the disc 330. FIG. 3D illustrates a first fin 341 disposed on one side of a diameter D of the disc 330 and a second fin 342 disposed on the opposite side of the diameter D parallel to the first fin 341. In another implementation, the fins 340 may protrude from the bottom side of the disc 330 toward the substrate 360 at about ninety degrees from the bottom side of the disc 330.

Although the stirring apparatus 320 is described as having two fins 340. It should be understood that in some implementations, the stirring apparatus 320 may have more than two fins 340. For instance, the stirring apparatus 300 may have three fins, wherein each fin is radially disposed at about sixty degrees from each other. As another example, the stirring apparatus 300 may have four fins, wherein each fin is radially disposed at about ninety degrees from each other. In some implementations, the fins may be radially disposed at unequal angles from each other.

The stirring apparatus 320, including the disc 330 and the fins 340, may be made from any type of material that does not interact with chemicals used during combinatorial processing. For example, the stirring apparatus 320, including the disc 330 and the fins 340, may be made from polytetrafluoroethylene (PTFE), ethylene chlorotrifluoroethlyene (ECTFE), perfluoroalkoxy (PFA) and the like. The material of the stirring apparatus 320 may be selected based on a number of characteristics, such as inertness, material and chemical compatibility, durability and cost.

In operation, the stirring apparatus 320, including the disc 330 and the fins 340, is configured to spin or rotate about the central axis 315 of the stirring apparatus 310. The liquid dispenser 350 may provide liquid onto the disc 330 as the disc 330 is rotating. In this manner, the disc 330 is configured to receive liquid from the liquid dispenser 350 and distribute the liquid substantially evenly around the periphery of the flow cell 300. The fins 340 may then draw the liquid from the periphery of the flow cell 300 into the center of the flow cell 300. Such flow pattern allow liquid to be distributed substantially evenly throughout the region defined by the flow cell 300, including areas beneath the disc 330.

The flow cell 300 may further include a set of vacuum tubes 380 for removing excess fluid from the substrate 360. The vacuum created by the vacuum tubes 380 may provide a perimeter seal with the substrate 320 at the periphery of the flow cell 300. The flow cell 300 may also include a vent hole 390 through which various gases may flow out of the flow cell 300.

Figure 4:
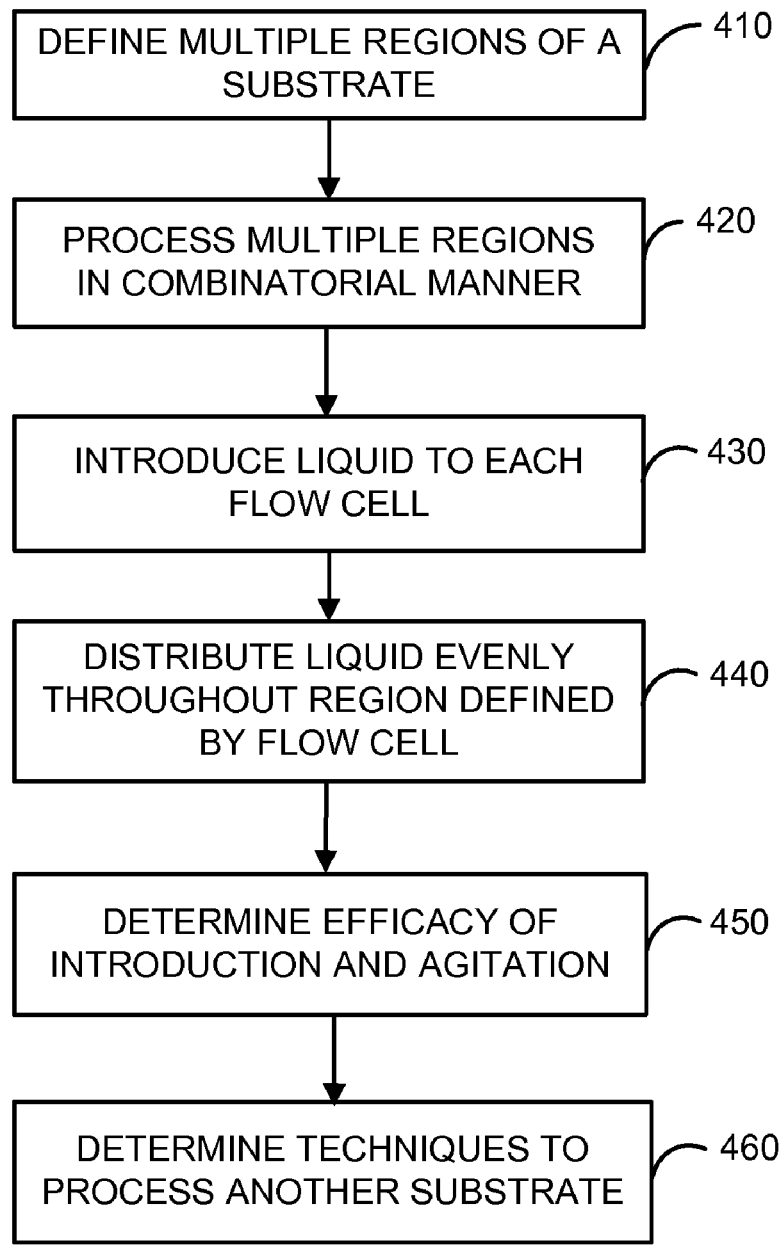
FIG. 4 illustrates a flow diagram describing a method for processing multiple regions of a substrate in a combinatorial manner using a stirring apparatus according to various technologies described herein.

FIG. 4 illustrates a flow diagram describing a method 400 for processing multiple regions of a substrate in a combinatorial manner using a stirring apparatus according to various technologies described herein. At step 410, multiple regions of a substrate may be defined. The multiple regions may be the regions 222 described in FIG. 2. The regions may also include structures on which combinatorial processing is to be performed. For example, the regions may include dielectric and conductive regions (e.g., metallization), deposited metals, semiconductor devices (e.g., transistors, diodes) and areas that have been planarized. The regions may be predefined, and a substrate may include any number of regions.

At step 420, the multiple regions may be processed in a combinatorial manner. The processing may include preparing the regions for combinatorial processing, or actual combinatorial processing and evaluation thereof, such as performing a clean operation or depositing a layer (e.g., using electroless or electrochemical deposition). Other combinatorial processes, including other types of depositions (e.g., spin-on deposition) are also possible. Combinatorial processing may vary one or more of unit processes (i.e., individual process operations such as the application of a chemical solution), process sequences (i.e., the order of the unit processes), or materials, for example.

At step 430, a liquid may be introduced into each flow cell. In one implementation, the liquid may be introduced through the liquid dispenser 350. The liquid may be continuously introduced for a predetermined amount of time. In some implementations, the introduction of the liquid is a unit process that can be combinatorially varied across regions of a substrate or across multiple substrates. For example, liquids having different chemical compositions, temperatures, deposition rates, viscosities, etc. can be introduced for processing and evaluation.

At step 440, the liquid may be received by the disc 330 of the stirring apparatus 300. The disc 330 may be rotated while receiving the liquid. Due to the rotation of the disc 330 and the wedge shape of the disc 330, the liquid received by the disc 330 may be evenly distributed around the periphery region of the flow cell 300 defined by the floating sleeves 370. The fins 340 may then draw the liquid from the periphery region of the flow cell 300 into the center of the flow cell 300. In this manner, the liquid may be distributed substantially evenly throughout a region defined by the flow cell 300, including areas beneath the disc 330.

At step 450, the efficacy of the introduction of the liquid and its agitation may be determined. Step 450 may be considered part of a combinatorial evaluation process, and may include characterization such as electrical testing or metrology. The results of the introduction and agitation may be reviewed to determine the efficacy of the formulation. If the formulation is effective, useful, or somehow otherwise desirable, the formulation may be used in further combinatorial processing, used on a full wafer, or used in production.

In one implementation, each region may include at least one structure. A portion of the structure may be formed to perform tests on the structures. The structure may be any semiconductor feature, including front end of the line (FEOL) features, such as transistors, or back end of the line (BEOL) features, such as metallization. Determining the efficacy of the introduction and agitation may include evaluating the characteristics of the structure after the introduction and agitation.

At step 460, techniques to process another substrate may be determined. The techniques may be based on the introduction and agitation of the liquid. For example, based on the efficacy of the introduction and agitation, it may be determined that a certain formulation is useful for a full wafer. The techniques may include spinning another liquid compositionally similar to the liquid onto substantially an entire surface of another substrate (e.g., using a spin processor).

Various implementations of the stirring apparatus 320 having the disc 330 and the fins 340 described herein may therefore operate to homogenize the chemical reaction over the area of the substrate enclosed by the flow cell 300. It does this by mixing new liquid with the old so that the concentration of the liquid is more uniform across this enclosed area. This is similar to the operation performed by a spin processor, i.e., evenly distributing liquid across the substrate so that the reaction is rotationally symmetric.

As such, the stirring apparatus 320 having the disc 330 and the fins 340 described herein is useful for combinatorial processing because it can simulate a full-wafer process, e.g., spin processing, in a much smaller region. Further, it can simulate a process that rotates a wafer without rotating the region so that multiple sites of the same substrate may be processed simultaneously.

While the foregoing is directed to implementations of various technologies described herein, other and further implementations may be devised without departing from the basic scope thereof, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus for stirring liquid inside a flow cell, comprising:
   a rotatable disc configured to receive liquid at a top side of the disc and distribute the liquid substantially evenly around a periphery of the flow cell, wherein the disc has a triangular cross sectional area; and
   a set of fins attached to a bottom side of the disc, wherein the set of fins is configured to draw the liquid from the periphery of the flow cell into the center of the flow cell, wherein the set of fins protrudes from a bottom side of the disc toward a substrate, wherein the set of fins comprises a first fin and a second fin parallel to the first fin, and wherein the first fin and the second fin are disposed at an offset from the diameter of the disc.

2. The apparatus of claim 1, wherein the disc and the set of fins are configured to homogenize a chemical reaction over an area enclosed by the flow cell.

3. The apparatus of claim 1, wherein the disc has a cross section of a wedge.

4. The apparatus of claim 1, wherein the disc is made from polytetrafluoroethylene (PTFE), ethylene chlorotrifluoroethlyene (ECTFE), perfluoroalkoxy (PFA) or polychlorotrifluoroethylene (PCTFE).

5. The apparatus of claim 1, wherein the disc forms a slope of about fifteen degrees with respect to the bottom side of the disc.

6. The apparatus of claim 1, wherein the set of fins protrudes vertically from the bottom side of the disc at about 90 degree angle with respect to the bottom side of the disc.

7. The apparatus of claim 1, wherein the disc is approximately aligned along a central axis of the flow cell.

8. A method for performing a combinatorial process on a substrate, comprising:
   defining multiple regions on the substrate;
   processing the multiple regions in a combinatorial manner;
   introducing liquid to one of the multiple regions; and
   distributing the liquid substantially evenly around a periphery of the one of the multiple regions using a rotatable disc; and
   drawing the liquid into the center of the one of the multiple regions using a set of fins attached to a bottom side of the disc, wherein the disc forms a slope of about fifteen degrees with respect to the bottom side of the disc.

9. The method of claim 8, wherein the disc has a triangular cross sectional area.

10. The method of claim 8, wherein the disc has a cross section of a wedge.

11. The method of claim 8, wherein the set of fins comprises a first fin and a second fin parallel to the first fin and wherein the first fin and the second fin are disposed at an offset from the diameter of the disc.

12. The method of claim 8, further comprising rotating the disc and the set of fins while receiving the liquid at a top side of the disc.

13. The method of claim 8, further rotating the disc and the set of fins while keeping the substrate stationary.

14. The method of claim 8, further comprising introducing a second liquid to another one of the multiple regions, wherein the second liquid is different from the liquid introduced to the one of the multiple regions.

15. The method of claim 8, wherein the disc and the set of fins are configured to substantially mimic a spin processor.

16. The method of claim 8, wherein processing the multiple regions in the combinatorial manner comprises varying one or more unit processes, materials, process sequences or combinations thereof across the multiple regions.

17. A combinatorial semiconductor processing system, comprising:
   a plurality of flow cells, wherein each flow cell comprises:
      a chamber;
      a liquid dispenser for introducing liquid into the chamber; and
      a stirring apparatus for agitating the liquid, wherein the stirring apparatus comprises a disc for receiving the liquid and distributing the liquid substantially evenly around a periphery of the flow cell and a set of fins disposed below the disc for drawing the liquid from the periphery toward the center of the flow cell, wherein the set of fins includes a first fin and a second fin parallel to the first fin, the first fin and the second fin are disposed at an offset from the diameter of the disc.

18. The system of claim 17, wherein the flow cell further comprises one or more vacuum tubes for removing excess liquid from the flow cell.

19. The system of claim 17, wherein the disc has a cross section of a wedge.

20. The system of claim 17, wherein the system is configured to vary one or more unit processes, materials, process sequences across multiple regions of a substrate.

21. An apparatus for stirring liquid inside a flow cell, comprising:
   a rotatable disc configured to receive liquid at a top side of the disc and distribute the liquid substantially evenly around a periphery of the flow cell, wherein the disc has a triangular cross sectional area; and
   a set of fins attached to a bottom side of the disc, wherein the set of fins is configured to draw the liquid from the periphery of the flow cell into the center of the flow cell, wherein the disc forms a slope of about fifteen degrees with respect to the bottom side of the disc.

22. A method for performing a combinatorial process on a substrate, comprising:
   defining multiple regions on the substrate;
   processing the multiple regions in a combinatorial manner;
   introducing liquid to one of the multiple regions; and
   distributing the liquid substantially evenly around a periphery of the one of the multiple regions using a rotatable disc; and
   drawing the liquid into the center of the one of the multiple regions using a set of fins attached to a bottom side of the disc, wherein the set of fins comprises a first fin and a second fin parallel to the first fin and wherein the first fin and the second fin are disposed at an offset from the diameter of the disc.

* * * * *